United States Patent
Kuo et al.

(10) Patent No.: US 6,222,861 B1
(45) Date of Patent: Apr. 24, 2001

(54) METHOD AND APPARATUS FOR CONTROLLING THE WAVELENGTH OF A LASER

(75) Inventors: Chien-Yu Kuo, Cupertino; Niraj Gupta, Fremont, both of CA (US)

(73) Assignee: Photonic Solutions, Inc., San Jose, CA (US)

( * ) Notice: Subject to any disclaimer, the term of this patent is extended or adjusted under 35 U.S.C. 154(b) by 0 days.

(21) Appl. No.: 09/145,927

(22) Filed: Sep. 3, 1998

(51) Int. Cl.$^7$ .......................................... H01S 3/10
(52) U.S. Cl. .................. 372/20; 372/20; 372/38; 372/32; 372/26
(58) Field of Search ................. 372/20, 32, 38, 372/29, 25, 26

(56) References Cited

U.S. PATENT DOCUMENTS

| 5,170,274 |   | 12/1992 | Kuwata et al. ............... 359/182 |
| 5,220,578 | * | 6/1993  | Koch et al. ................... 372/96 |
| 5,553,087 |   | 9/1996  | Telle .............................. 372/32 |
| 5,659,560 | * | 8/1997  | Ouchi et al. .................. 372/27 |
| 5,673,129 |   | 9/1997  | Mizrahi ....................... 359/124 |
| 5,706,301 |   | 1/1998  | Lagerström .................. 372/32 |
| 5,715,265 | * | 2/1998  | Epworth ....................... 372/38 |
| 5,745,282 |   | 4/1998  | Negi ............................. 359/322 |
| 5,825,792 | * | 10/1998 | Villeneuve et al. ........... 372/32 |
| 5,832,014 | * | 11/1998 | Johnson ........................ 372/32 |
| 5,886,802 | * | 3/1999  | Majima ........................ 359/124 |
| 6,064,681 | * | 5/2000  | Ackerman ..................... 372/32 |
| 6,078,418 | * | 6/2000  | Hansen et al. ................ 359/161 |
| 6,094,446 | * | 7/2000  | Tei et al. ...................... 372/32 |

* cited by examiner

*Primary Examiner*—Frank G. Font
*Assistant Examiner*—Delma R. Flores Ruiz
(74) *Attorney, Agent, or Firm*—Townsend & Townsend & Crew LLP

(57) ABSTRACT

A method and apparatus for controlling the wavelength of a laser. Initially, the wavelength of the laser is coarsely tuned to within a predetermined window around a specified wavelength. After coarse adjustment, a wavelength control loop is activated to finely tune and lock the laser wavelength. In an embodiment, the control loop dithers the wavelength of the optical carrier signal from the laser. The optical carrier signal is then modulated (i.e., with data) in the normal manner. A portion of the modulated optical signal is filtered and detected. The amplitude and phase of the detected signal, which comprises the error signal, is processed and averaged. The averaged signal is then summed with a dither signal to provide a composite signal. A control signal corresponding to the composite signal is then generated and used to adjust the laser wavelength.

21 Claims, 3 Drawing Sheets

METHOD AND APPARATUS FOR CONTROLLING THE WAVELENGTH OF A LASER

BACKGROUND OF THE INVENTION

The present invention relates generally to laser, and more particularly to a method and apparatus for controlling the wavelength of a semiconductor laser (also referred to as a laser diode, or simply a laser).

A laser is an essential element in an optical communications system. The laser provides an optical carrier signal (i.e., the light) upon which data can be modulated and transmitted. Typically, the modulated optical signal is transmitted through a fiber optic cable to an optical receiver that demodulates the signal to obtain the data. Conventionally, only one optical signal (or one channel) is transmitted per optical fiber.

While demand for communications service increases, the capacity of optical communications systems is limited by the conventional one channel per optical fiber design. Although capacity can be increased by laying more fiber optic cables, the cost of such an expansion is prohibitive. The installation of optical fiber to interconnect various communications nodes represents a substantial investment of time and resources.

Wavelength division multiplexing (WDM) is a technology that increases the capacity of an existing fiber optic cable. A WDM system employs plural optical signal channels, with each channel assigned a particular wavelength. Each channel in a WDM system can be modulated at approximately the same data rate as a conventional single wavelength channel. Thus, the capacity of the fiber optic cable is increased by the number of channels utilized. For example, a four-channel WDM system has approximately four times the capacity of a single channel system. For the WDM system, the signal channels are (individually) generated, multiplexed together, and transmitted over the optical fiber. At the receiver, the WDM optical signal is demultiplexed and each channel is provided to an optical receiver that demodulates the channel to obtain the data.

Dense wavelength division multiplexing (DWDM) is a further extension of WDM and delivers even greater capacity. A DWDM system utilizes even more optical signal channels that are spaced more closely (i.e., the wavelengths are closer together) than a WDM system. Again, since each channel has a capacity that is approximately equal to that of the conventional single wavelength channel, the capacity of the DWDM system is increased by the ability to more closely space the channels.

The ability to multiplex a large number of wavelengths relatively close together is determined, to a large extent, by the ability to accurately control the wavelength of each transmitting source. As an optical signal in the DWDM optical signal drifts (i.e., in wavelength), it generates "crosstalk" and interferes with adjacent channels.

Accurate control of a laser wavelength is also important for other practical considerations. Conventionally, a DWDM transmitter is designed with a small range of wavelengths. The range can be expressed in terms of "wavelengths on ITU (International Telecommunications Union) grids", with each wavelength on the ITU grids corresponding to a difference of 0.8 nm (or 100 GHz) at a nominal wavelength of 1550 nm. The small range of the conventional DWDM transmitter is dictated by fundamental limits of the laser (e.g., a DFB laser) used within the transmitter and typically covers only two to three wavelengths on the ITU grids (i.e., approximately 200 to 300 GHz). To increase system reliability, many DWDM systems provide redundant (i.e., spare or backup) units that, collectively, covers the full span of the ITU operating wavelengths. Using conventional DWDM transmitter design, many spare units would be required because of the limited wavelength range of each unit.

Typically, the wavelength of a laser can be controlled by adjusting the temperature and the drive current of the laser. The drive current can be composed of several components, including a coupler current, a reflector current, and a phase current. Generally, the wavelength versus temperature and the wavelength versus drive current characteristics are not linear functions. In fact, these characteristics are often provided by the laser manufacturer by a special wavelength tuning algorithm or a special table, or both.

Various methods to control the wavelength of a laser have been developed in the art. For example, U.S. Pat. No. 5,706,301 to Lagerstrom discusses a laser wavelength control system that adjusts the laser wavelength by controlling the temperature of the laser. The temperature is controlled based on a difference in a transmitted optical signal (i.e., from the laser through a reflector) and a reflected optical signal (i.e., from the reflector). U.S. Pat. No. 5,553,087 to Telle discusses a frequency stabilized laser diode wherein the wavelength is set by adjusting the temperature of the laser diode until a certain condition is met and then adjusting the drive current of the laser diode. These conventional techniques generally adjust the laser wavelength by controlling temperature. Furthermore, these patents fail to account for the complex characteristics (i.e., the wavelength versus drive current) of the laser.

SUMMARY OF THE INVENTION

The present invention provides method and apparatus for controlling the wavelength of a laser. The present invention provides precise wavelength control over a wide range of wavelength, and is especially suited for controlling the wavelength of wide tuning lasers. This precision and range control is not possible with conventional wavelength tuning techniques. The present invention uses a combination of a "feed-forward" loop to quickly adjust the wavelength of the laser to within a predetermined window around a specified (e.g., ITU) wavelength, and a feedback loop to accurately adjust and maintain the wavelength at the specified wavelength. In one embodiment, the wavelength is controlled by adjusting the drive current of the laser, which allows for precise control.

In an embodiment, the control loop dithers the wavelength of the optical carrier signal from the laser. The optical carrier signal is then modulated in the normal manner (i.e., with data using on-off keying). A portion of the modulated optical signal is filtered and detected. The amplitude and phase of the detected signal, which comprises the error signal, is processed and averaged. The averaged signal is then summed with a dither signal to provide a composite signal. A control signal corresponding to the composite signal is then generated and used to adjust the laser wavelength.

In a specific embodiment, a method is provided for controlling a wavelength of a laser. The wavelength of an optical signal from the laser is dithered. The dithered signal is then detected to generate an error signal. The error signal is averaged to generate a control signal that is used to control the wavelength of the laser. The dithered signal can "bear" the signature of the wavelength relative to the specified (ITU) wavelength.

In another specific embodiment, a control circuit is provided for controlling a wavelength of a laser. The control circuit includes a laser, a detector, and a loop filter. The wavelength of the laser is dithered with a dither signal. The detector couples to the laser, receives the dithered signal, and generates an error signal. The loop filter couples to the detector, receives the error signal, and generates a control signal. The control signal is used to control the wavelength of the laser. An optical comb filter can be interposed between the laser and the detector, to receive the dithered signal and provide a filtered signal to the detector.

In yet another specific embodiment, a laser transmitter is provided that includes a laser, a modulator driver, a modulator, a filter, a detector, a loop filter. The wavelength of the laser is dithered with a dither signal. The modulator driver receives data and provides corresponding drive signals. The modulator couples to the laser and the modulator driver, and modulates an optical carrier signal from the laser with the drive signals from the modulator driver. The filter couples to the modulator, receives the modulated optical signal, and generates a filtered signal. The detector couples to the filter, receives the filtered signal, and generates an error signal. The loop filter couples to the detector, receives the error signal, and generates a control signal. The control signal is used to control the wavelength of the laser.

The foregoing, together with other aspects of this invention, will become more apparent when referring to the following specification, claims, and accompanying drawings.

DESCRIPTION OF THE SPECIFIC EMBODIMENTS

System Overview

Figure 1:
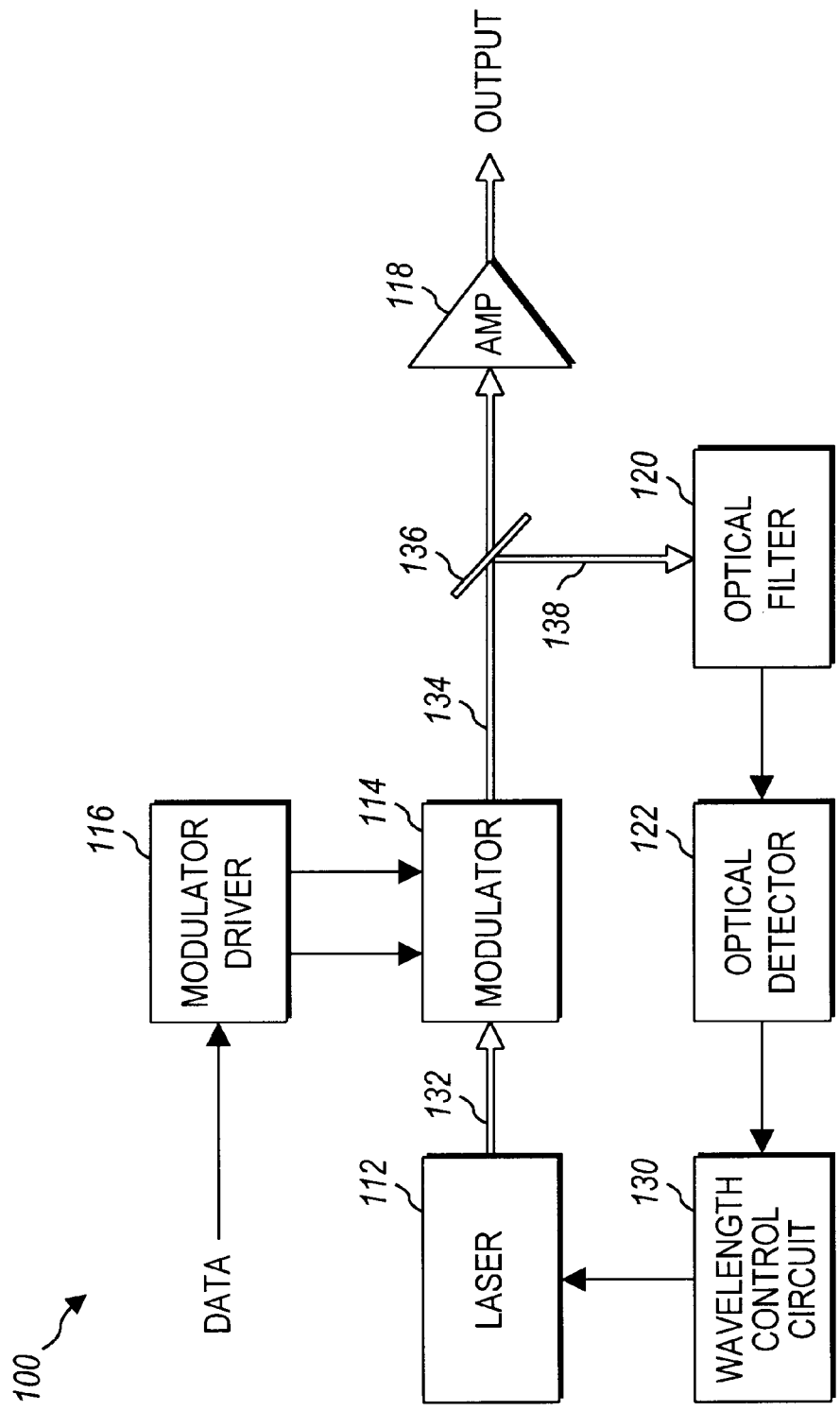
FIG. 1 shows a block diagram of an embodiment of a laser transmitter.

FIG. 1 shows a block diagram of an embodiment of a laser transmitter 100. Laser transmitter 100 can be used in various applications including optical communications systems (i.e., WDM and DWDM systems) and instrumentation (i.e., semiconductor, spectroscopy, gas analysis, optical reflectometry, and radar systems). Specifically, laser transmitter 100 can be used as a DWDM transmitter.

Laser transmitter 100 includes a tunable laser 112, a modulator 114, a modulator driver 116, an optical amplifier 118, an optical filter 120, an optical detector 122, and a wavelength control circuit 130. These various components are further described below. The optical carrier signal (i.e., the light) from laser 112 is provided through a polarizing maintaining fiber (PMF) 132 to modulator 114. Modulator 114 also receives drive signals from modulator driver 116 and modulates the optical carrier signal with the drive signals. The modulated optical signal is then transmitted through an optical fiber 134 and further through a beam splitter 136 to amplifier 118. Amplifier 118 increases the strength of the optical signal and provides the amplified signal at a predetermined power level as the output of laser transmitter 100.

Beam splitter 136 directs a (small) portion of the modulated optical signal through an optical fiber 138 to optical filter 120. Optical filter 120 filters the optical signal and provides the filtered signal to optical detector 122. Optical detector 122 converts the received optical signal into an electrical representation and sends the electrical signal to wavelength control circuit 130.

Within wavelength control circuit 130, the electrical signal is digitized and processed. A control signal is then generated based on the processed signal. The control signal drives laser 112 to the proper wavelength.

Wavelength Control

Initially, laser transmitter 100 receives a command to operate at a specific wavelength. Typically, laser 112 is "heated" to a predetermined temperature (i.e., approximating the final operating temperature) before the wavelength control mechanism is activated. Wavelength control circuit 130 then generates a coarse control signal for laser 112 based on a wavelength tuning algorithm, a wavelength mapping table, or other sources of information. The algorithm or table can be provided by the laser manufacturer or generated by wavelength control circuit 130 based on a priori or dynamic characterization of laser 112. Coarse tuning moves the wavelength of laser 112 to within a predetermined window (i.e., within 50 GHz of the specified UTU wavelength) so that the wavelength control loop can successfully "lock."

After laser 112 has been coarsely tuned, fine adjustment and locking of the wavelength of laser 112 is performed by the wavelength control loop. The wavelength control loop is a feedback control loop that continually adjusts the wavelength of laser 112 to maintain the specified wavelength.

In an embodiment, the wavelength of the optical carrier signal from laser 112 is dithered by a dither signal in the control loop. The optical carrier signal is then modulated (i.e., with data) in the normal manner. Next, a portion of the modulated optical signal is filtered and detected. The amplitude and phase of the detected signal (i.e., at the dither frequency or at higher harmonics of the dither frequency) comprises the error signal that is then processed and averaged. The averaged signal is then summed with a dither signal to provide a composite signal. A control signal corresponding to the composite signal is then generated and used to adjust the wavelength of laser 112.

Figure 2:
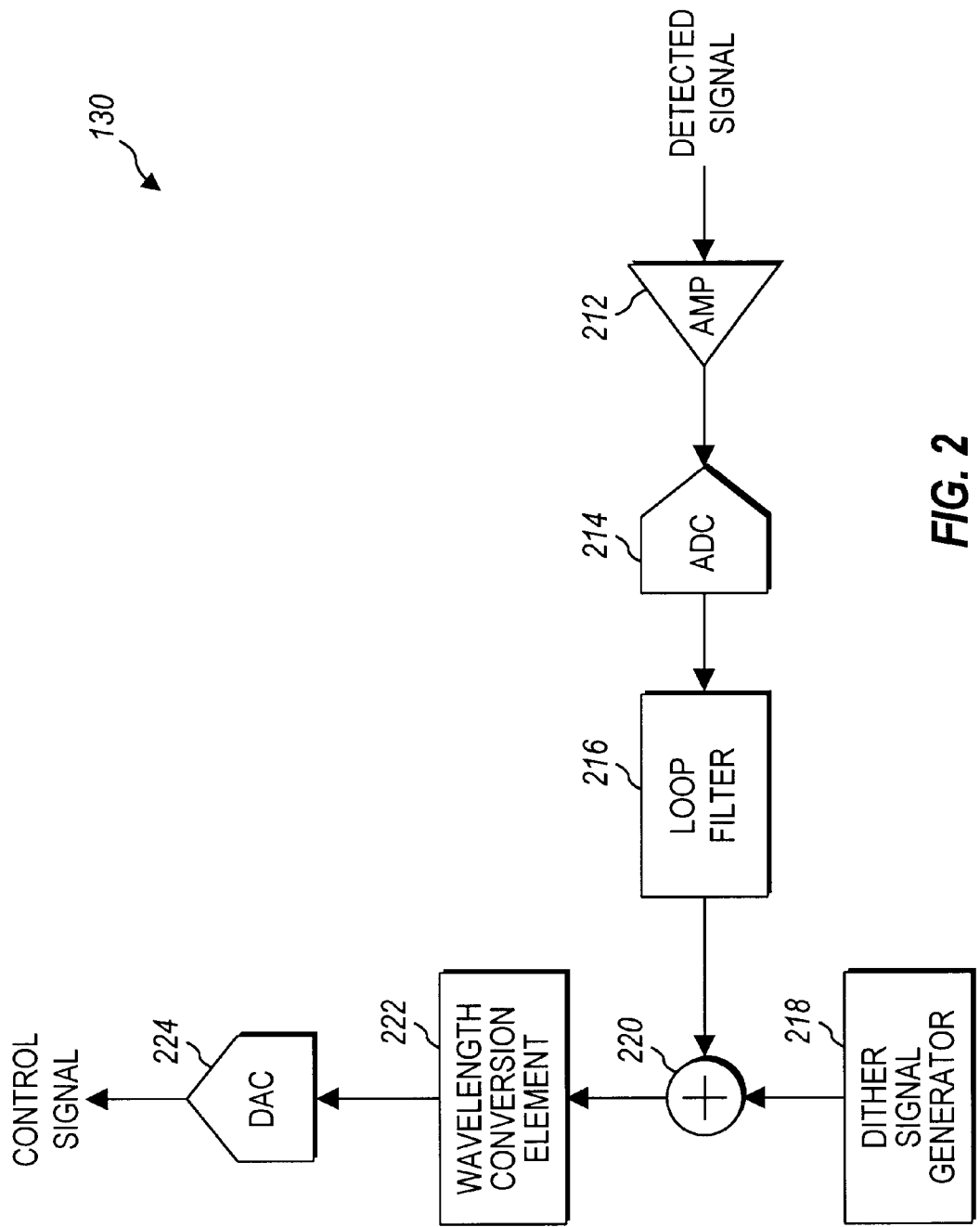
FIG. 2 shows a block diagram of an embodiment of a wavelength control circuit.

FIG. 2 shows a block diagram of an embodiment of wavelength control circuit 130. Wavelength control circuit 130 includes some of the elements of the wavelength control loop, with the remaining elements being shown in FIG. 1. As shown in FIG. 2, the detected signal from optical detector 122 is provided to an electrical amplifier 212 that conditions the signal. Electrical amplifier 212 can also include a filter to remove out-of-band noise. The conditioned signal is provided to an analog-to-digital converter (ADC) 214 that digitizes the signal. The digitized signal from ADC 214 is provided to a loop filter 216 that averages the signal in accordance with a loop transfer function.

The averaged signal from loop filter 216 and a dither signal from a dither signal generator 218 are provided to a summer 220 that combines the signals. A composite signal from summer 220 is provided to a wavelength conversion element 222 that generates a signal corresponding to the composite signal. Wavelength conversion element 222 can include the wavelength tuning algorithm or the wavelength mapping table as described above. The signal from element 222 is converted to an analog control signal by a digital-to-analog converter (DAC) 224. Filtering (i.e., for sinx/x correction and image rejection) is typically performed in DAC 224. The control signal is provided to laser 112.

At least some of the components described above can be implemented within a digital signal processor (DSP). For example, loop filter 216, dither signal generator 218, and wavelength conversion element 222 can be included in the DSP. The DSP can be a custom designed circuit or a standard part from a manufacturer, such as the TMS320 DSP from Texas Instrument. These components can also be implemented using a processor, a microcomputer, a controller, a signal processor, an application specific integrated circuit (ASIC), a memory device, or the like.

The integration of the components of the wavelength control loop within a DSP can provide additional advantages. For example, the DSP allows for easy modification and upgrade of the control loop (i.e., through the use of programmable features). The DSP also provides loop components that do not drift with time, temperature, and so on. The DSP can also incorporate control for other features of laser transmitter 100, including laser 112 and modulator 114.

Numerous other designs can also be used for wavelength control circuit 130. For example, loop filter 216 can be implemented as an analog circuit that is interposed between ADC 214 and amplifier 212 or located after DAC 224.

Error Detection

Figure 3:
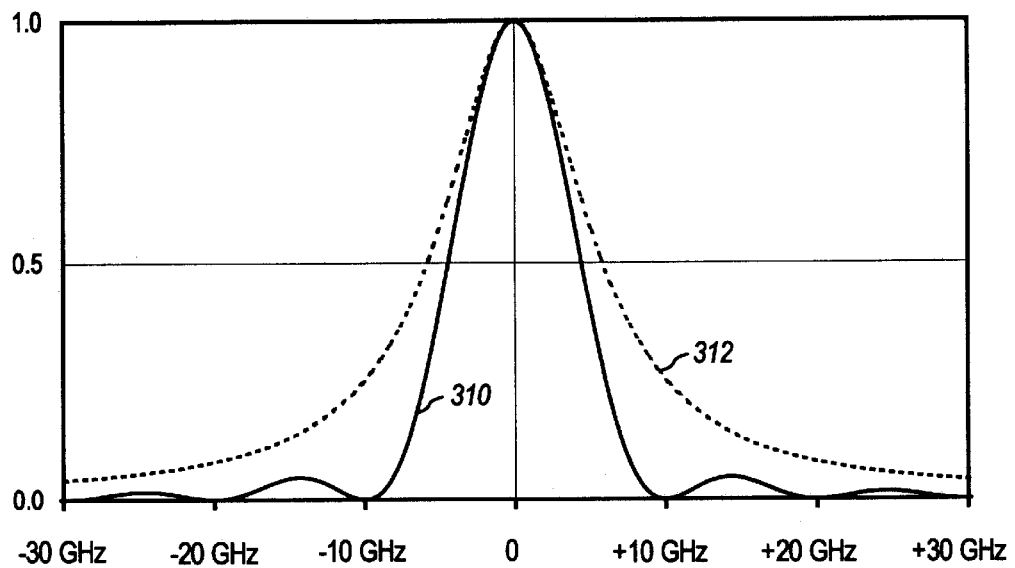
FIG. 3 shows a spectrum of a modulated optical signal from the modulator and a frequency response of a filter used to filter the modulated optical signal.

FIG. 3 shows a spectrum 310 of the modulated optical signal from modulator 114. For on-off keying modulation using none-return-to-zero (NRZ) data format at 10 GBps, the spectrum of the modulated optical signal has a sinx/x shape, as illustrated by spectrum 310 in FIG. 3. The (−3 dB) bandwidth of the spectrum is equal to the data rate.

FIG. 3 also shows a frequency response 312 of filter 120. In one embodiment, filter 120 is a Fabry-Perot filter that has a finesse of six and a free spectral range (FSR) of 100 GHz. Filter 120 filters spectrum 310 and provides the output to optical detector 122. In one embodiment, filter 120 is temperature stabilized and can be viewed as an absolute frequency standard. Thus, a complete tracking of the laser wavelength with respect to the peaks of filter 120 signifies the quality of wavelength locking.

The signal detected by optical detector 122 is the overlap of spectrum 310 and frequency response 312. As the wavelength of laser 112 is dithered, spectrum 310 of the modulated optical signal moves left and right. Since the frequency response 312 of optical filter 120 is approximately fixed, the signal detected by optical detector 122 varies as spectrum 310 is shifted left and right.

Figure 4:
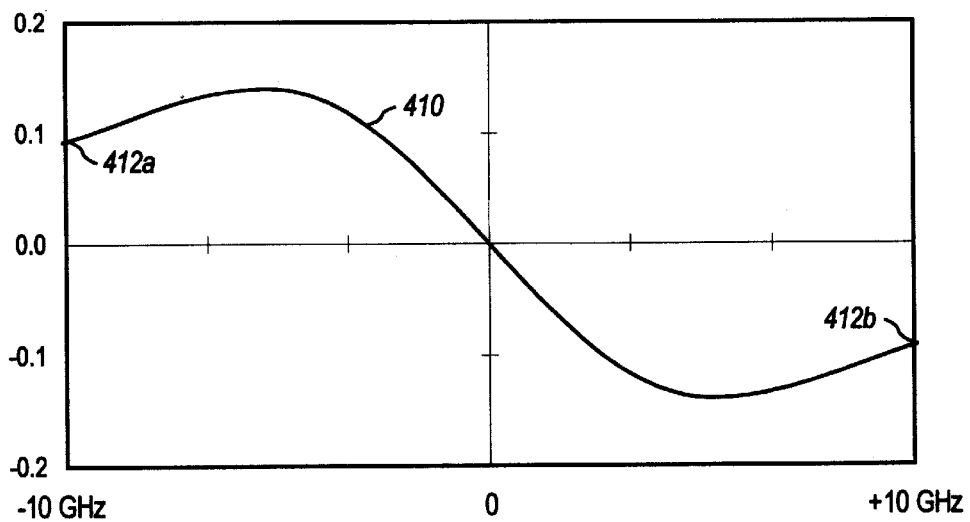
FIG. 4 shows a plot of error signal with normalized magnitude from the optical detector.

FIG. 4 shows a plot 410 of error signal with normalized magnitude from optical detector 122. When spectrum 310 is centered with respect to frequency response 312, the normalized magnitude is zero, as shown by plot 410. When spectrum 310 is higher in frequency than frequency response 312, the magnitude of the detected signal is less than the normalized value. Alternatively, when spectrum 310 is lower in frequency than frequency response 312, the magnitude of the detected signal is greater than the normalized value. End points 412a and 412b of plot 410 correspond to misalignment of −10 GHz and +10 GHz, respectively, between spectrum 310 and frequency response 312. End point 412a corresponds to a magnitude obtained when spectrum 310 is centered against the −10 GHz in the plot in FIG. 3. Similarly, end point 412b corresponds to a magnitude obtained when spectrum 310 is centered against the +10 GHz. The slope of plot 410 represents the gain of the "phase detector" within the wavelength control loop and is used for locking.

Dithering

Generally, the dither signal used to perturb the wavelength of laser 112 is low amplitude and has a bandwidth substantially lower than the modulating data rate (e.g., $10^{-5}$ times the data rate, or less). The dither signal is generated by dither signal generator 218 and can be sinusoidal, triangular, sawtooth, or other signal types. These various signal types can be generated by the use of a look-up table within generator 218. The frequency of the dither signal can be controlled by a firmware routine written in the DSP, or an external clock (not shown) and a numerically controlled oscillator (NCO) (also not shown).

The amount of deviation (i.e., in wavelength or frequency) is determined by the amplitude of the dither signal. The rate of the deviation is determined by the frequency of the dither signal. Thus, the amplitude of the dither signal controls the amount of movement in spectrum 310 (i.e., how far left and right) and the frequency of the dither signal controls the rate at which the movement occurs. In one embodiment, the amplitude of the dither signal is selected such that the peak frequency deviation is 2 GHz, at a dither frequency generally less than $10^{-5}$ times the data rate.

In one embodiment, the dither signal is included in the control signal that is provided to one of the tuning currents of laser 112. In another embodiment, the dither signal is provided to one tuning current of laser 112 and the wavelength control signal (i.e., from loop filter 216) is provided to another tuning current.

Loop Response

The wavelength control loop includes laser 112, filter 120, loop filter 216, and other components. The response of the wavelength control loop is determined by the characteristics (i.e., the transfer functions) of all components within the loop. The loop response, in turn, determines the settling time, the acquisition range, and the tracking ability of the loop. The loop response also determines the phase noise of the optical carrier signal. Typically, the characteristics of all components, except for loop filter 216, are predefined and cannot be adjusted. Thus, the loop response of the wavelength control loop is determined, to a large extent, by the transfer function of loop filter 216.

Generally, a wide loop response corresponds to faster settling time, wider acquisition range, but worse tracking and phase noise performance. Alternatively, a narrow loop response corresponds to slower settling time, more narrow acquisition range, but improved tracking and phase noise performance.

In one embodiment, loop filter 216 can be implemented as a programmable element to allow adjustment of the loop response based on the system requirement. For example, initially, the loop response can be set wide for increased likelihood of acquisition and quicker settling time. Once the wavelength of laser 112 has been approximately adjusted to the specified wavelength, the loop response can be narrowed for improved tracking and phase noise performance.

The transfer function of loop filter 216 can also be adjusted based on the transfer function of laser 112 (and other components within the wavelength control loop) to maintain an approximately constant loop response as laser 112 is tuned across a range of wavelengths. As will be described below, the transfer function of laser 112 can be a complex, nonlinear function. Furthermore, the transfer function can change over temperature and time. Typically, the transfer function is known a priori (or can be measured) and made available to wavelength control circuit 130. Wavelength control circuit 130 can automatically adjust the transfer function of loop filter 216 based on its knowledge of the current operating condition (i.e., the transfer function of laser 112) to maintain the desired loop response.

For example, the transfer function of loop filter 216 can be adjusted based on the operating wavelength of laser 112.

At a particular laser wavelength, the transfer gain (e.g., the change in wavelength versus the change in drive current) of laser 112 can be determined. This gain can be used in the loop equations to compute a new response for loop filter 216 such that the response of the wavelength control loop is approximately constant.

In one embodiment, loop filter 216 is implemented as a digital loop filter within a digital signal processor. This allows for easy programming of the transfer function of loop filter 216. However, loop filter 216 can also be implemented using analog components.

Wavelength Conversion Element

In one embodiment, laser 112 is a wide tuning laser that covers a wide range of wavelengths. The wavelength of laser 112 can be controlled by adjusting the temperature and the drive current of laser 112. The drive current can be composed of several components, including a gain current, a coupler current, a reflector current, and a phase current. In one embodiment, the wavelength control loop controls the wavelength of laser 112 through adjustment of the drive current only.

Typically, the wavelength versus drive current transfer function is a complex nonlinear function. In fact, this transfer function is often provided by the laser manufacturer through a special wavelength tuning algorithm or a special wavelength mapping table, or both. The algorithm or table can be stored within wavelength conversion element 222. Alternatively, the transfer function of laser 112 can be computed dynamically during the operation of laser transmitter 100. This allows laser transmitter 100 to update the transfer function to reflect changes in the operating conditions (i.e., due to temperature, aging, and so on).

Wavelength conversion element 222 receives a composite signal from adder 220 and provides a signal indicative of the drive current needed to adjust the wavelength of laser 112 to the desired value. Element 222 can be implemented as a random-access memory (RAM), a read-only memory (ROM), a programmable read-only-memory (PROM), an electronically programmable read-only-memory (EPROM), an electronically erasable and programmable read-only-memory (EEPROM), a FLASH memory, registers, combinatory logic, or other similar devices.

Other Considerations

The wavelength control loop can also be designed to take into account other considerations. For example, a circuit within laser transmitter 100 can be used to control the dispersion effect of the modulated optical signal. This circuit then contains the information as to the optimal (or near optimal) wavelength locking condition based on the type of modulation. This information can then be used to "offset" the nominal wavelength locking.

Referring to FIG. 2, the error signal from amplifier 212 can also be adjusted based on the magnitude of the detected signals at the input of amplifier 212. For example, amplifier 212 can be implemented as an automatic gain control (AGC) amplifier that maintains an approximately constant output signal amplitude. The AGC amplifier can be adjusted by a gain control loop (not shown).

Laser Transmitter Components

Referring back to FIG. 1, laser 112 can be of any laser type that is known or used in the art. In one embodiment, laser 112 is a distributed Bragg reflector (DBR) laser that can be tuned over 40 nm to cover approximately 50 ITU wavelengths at a nominal wavelength of 1535 to 1580 nm. Generally, the DBR laser can be reliably tuned to within 50 GHz of any of the 40 (or a subset) ITU wavelengths. The DBR laser has high output power, low relative intensity noise (RIN), and low phase noise (i.e., narrow line width). The DBR laser can be enclosed in a hermetically sealed package and can include a polarization maintaining fiber (PMF). However, the invention can be practiced using other lasers, including a distributed feedback (DFB) laser, a sampled grating reflector (GCSR) laser, and others.

Modulator 114 can be of various types. For example, modulator 114 can be an electro-optic modulator, an electro-absorption modulator, or other types of modulator. In one embodiment, modulator 114 is a lithium niobate ($LiNbO_3$) electro-optic modulator that is capable of being modulated at a data rate of 10 Gbps or more. Electro-optic modulators are further described by Becker in "Broad-Band Guided Wave Electrooptic Modulators", *IEEE Journal of Quantum Electronics,* Vol. QE-20, No. 7, July 1984, pp. 723–727, the disclosure of which is also incorporated herein by reference. Examples of electro-absorption modulators are described by Wood in "Multiple Quantum Well (MQW) Waveguide Modulators", *Journal of Lightwave Technology,* Vol. 6, No. 6, June 1988, pp. 743–757, the disclosure of which is incorporated herein by reference.

Modulator 114 is typically biased to provided the required level of performance. The optimal bias conditions for modulator 114 can drift due to charge accumulation on the electrodes, and the drift rate can depend on, for example, a z or an x cut modulator. A bias control circuit can be used to actively maintain (approximately) optimal bias conditions for modulator 114. In fact, this bias control circuit can implement a bias control loop, similar to the wavelength control loop, that dithers the optical power and adjusts the bias conditions to minimize a particular error. Generally, during the laser wavelength tuning operation, the modulator bias control circuit should be turned "off" and the same bias conditions should be maintained. After wavelength locking is achieved, the bias control loop can be turned "on" to allow for adjustment of the bias conditions.

Although the use of on-off keying modulation format and NRZ data format has been described, the invention is applicable for other modulation formats and data formats. For example, a return to zero (RZ) data format can be used.

Optical amplifier 118 can be an Erbium-doped fiber amplifier (EDFA), a Prasiodimium-doped fiber amplifier (PDFA), or other amplifiers. Furthermore, amplifier 118 can include multiple stages. Amplifier 118 can be used to provide an approximately constant output power level regardless of the operating wavelength of laser 112. Optical amplifiers are further described by Gowar in "Optical Communication Systems", (Prentice Hall, NY) 1993, by Bjarklev in "Optical Fiber Amplifiers: Design and System Applications", (Artech House, Norwood, Mass.) 1993, and by Desurvire in "Erbium-Doped Fiber Amplifiers", (John Wiley & Sons, Inc., NY) 1994. These disclosures are incorporated herein by reference.

Optical filter 120 can be a comb filter, such as a Fabry-Perot filter, an interference filter, or other filters. For example, optical filter 120 can also be a wavelength selector, such as a Bragg grating member, an array waveguide, or any other device that provides bandpass (or bandstop) filtering of the optical signal.

Beam splitter 136 can be an optical fiber fused coupler. In one embodiment, beam splitter 136 provides most of the modulated optical signal from modulator 114 to amplifier 118. Beam splitter 136 only directs a small portion (e.g., one percent) of the modulated optical signal to filter 120.

Conclusion

The present invention as described above provides precise wavelength control over a wide range of wavelength, and is especially suited for controlling the wavelength of wide tuning lasers. The present invention uses a combination of a "feed-forward" loop to quickly adjust the wavelength of the laser to within a predetermined window around a specified wavelength and a feedback loop to accurately adjust and maintain the wavelength at the specified wavelength. This combination is superior to conventional wavelength tuning techniques.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. For example, wavelength control circuit 130 can be implemented using mostly analog circuits. Thus, the present invention is not intended to be limited to the embodiments shown herein but is to be accorded the widest scope consistent with the principles and novel features disclosed herein.

What is claimed is:

1. A method for controlling a wavelength of a laser comprising:
   dithering the wavelength of an optical signal from the laser;
   modulating the optical signal from the laser with data at a data rate, wherein the dithering is performed at a rate that is a fraction of the data rate;
   detecting the dithered signal to generate an error signal; and
   averaging the error signal to generate a control signal;
   wherein the wavelength of the laser is further controlled by the control signal.

2. The method of claim 1 wherein the laser is a DBR laser.

3. The method of claim 1 wherein the dithering is performed by adjusting a drive current of the laser.

4. The method of claim 1 wherein the dithering is performed with a sinusoidal signal.

5. The method of claim 1 wherein the detecting is performed on a fraction of the dithered signal.

6. The method of claim 1 wherein the detecting comprises:
   filtering the dithered signal; and
   detecting the filtered signal with an optical detector.

7. The method of claim 6 wherein the filtering is performed using a comb filter.

8. The method of claim 6 wherein the filtering is performed using a Fabry-Perot filter.

9. The method of claim 1 further comprising:
   generating a dither signal;
   summing the dither signal with the averaged signal to generate a composite signal; and
   generating the control signal based on the composite signal.

10. The method of claim 1 further comprising:
    coarse tuning the wavelength of the laser to within a predetermined wavelength window.

11. The method of claim 10 wherein the coarse tuning is based on a wavelength tuning algorithm or a wavelength mapping table generated for the laser.

12. The method of claim 10 wherein the coarse tuning is performed by adjusting a drive current of the laser.

13. A method for controlling a wavelength of a laser comprising:
    dithering the wavelength of an optical signal from the laser;
    modulating the optical signal with data at a data rate, wherein the dithering is performed at a rate that is a fraction of the data rate;
    filtering the modulated signal;
    detecting the filtered signal to generate an error signal; and
    averaging the error signal to generate a control signal;
    wherein the wavelength of the laser is further controlled by the control signal.

14. A method for controlling a wavelength of a laser comprising:
    coarse tuning the wavelength of the laser to within a predetermined wavelength window, wherein the coarse tuning is based on a wavelength tuning algorithm or a wavelength mapping table generated for the laser;
    dithering the wavelength of an optical signal from the laser;
    modulating the optical signal with data;
    filtering the modulated signal;
    detecting the filtered signal to generate an error signal; and
    averaging the error signal;
    generating a dither signal;
    summing the dither signal with the averaged signal to generate a composite signal; and
    generating a control signal based on the composite signal;
    wherein the wavelength of the laser is further controlled by the control signal.

15. A control circuit comprising:
    a laser having a wavelength that is dithered with a dither signal;
    a modulator that modulates the dithered signal with data at a data rate, wherein the dithering is performed at a rate that is a fraction of the data rate
    a detector coupled to the laser for receiving the modulated signal and generating an error signal; and
    a loop filter coupled to the detector for receiving the error signal and generating a control signal;
    wherein the wavelength of the laser is further controlled by the control signal.

16. The control circuit of claim 15, further comprising:
    a filter interposed between the modulator and the detector, the filter filtering the modulated signal.

17. A control circuit comprising:
    a laser having a wavelength that is dithered with a dither signal at a first rate;
    a modulator coupled to the laser for receiving and modulating an optical carrier signal from the laser with data at a second rate, wherein the first rate is a fraction of the second rate;
    a filter coupled to the modulator for receiving the modulated optical signal and generating a filtered signal;
    a detector coupled to the filter for receiving the filtered signal and generating an error signal; and
    a loop filter coupled to the detector for receiving the error signal and generating a control signal;
    wherein the wavelength of the laser is further controlled by the control signal.

18. A laser transmitter comprising:
    a laser having a wavelength that is dithered with a dither signal at a first rate;
    a modulator driver for receiving data and providing drive signals;

a modulator coupled to the laser and the modulator driver, the modulator receiving and modulating an optical carrier signal from the laser with the drive signals from the modulator driver wherein the modulator modulates the optical carrier signal at a second rate, wherein the first rate is a fraction of the second rate;

a filter coupled to the modulator for receiving the modulated optical signal and generating a filtered signal;

a detector coupled to the filter for receiving the filtered signal and generating an error signal; and a loop filter coupled to the detector for receiving the error signal and generating a control signal;

wherein the wavelength of the laser is further controlled by the control signal.

19. A method for controlling a wavelength of a laser comprising:

dithering the wavelength of an optical signal from the laser, wherein the dithering is performed with a sinusoidal signal;

detecting the dithered signal to generate an error signal; and averaging the error signal to generate a control signal;

wherein the wavelength of the laser is further controlled by the control signal.

20. A method for controlling a wavelength of a laser comprising:

dithering the wavelength of an optical signal from the laser;

detecting the dithered signal to generate an error signal, wherein the detecting is performed on a fraction of the dithered signal; and averaging the error signal to generate a control signal;

wherein the wavelength of the laser is further controlled by the control signal.

21. A method for controlling a wavelength of a laser comprising:

coarse tuning the wavelength of an optical signal from the laser to within a predetermined wavelength window based on one of a wavelength tuning algorithm and a wavelength mapping table generated for the laser;

dithering the wavelength of the optical signal from the laser;

detecting the dithered signal to generate an error signal; and averaging the error signal to generate a control signal;

wherein the wavelength of the laser is further controlled by the control signal.

* * * * *